(12) United States Patent
Goldbach et al.

(10) Patent No.: US 6,674,113 B2
(45) Date of Patent: Jan. 6, 2004

(54) TRENCH CAPACITOR AND METHOD FOR MANUFACTURING THE SAME

(75) Inventors: Matthias Goldbach, Dresden (DE); Thomas Hecht, Dresden (DE); Jörn Lützen, Dresden (DE); Bernhard Sell, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/254,692

(22) Filed: Sep. 25, 2002

(65) Prior Publication Data

US 2003/0080367 A1 May 1, 2003

(30) Foreign Application Priority Data

Sep. 25, 2001 (DE) .......................... 101 47 120

(51) Int. Cl.[7] ...................... H01L 27/08; H01L 21/8242
(52) U.S. Cl. ...................... 257/301; 257/303; 438/243; 438/386
(58) Field of Search ................ 257/301–305; 438/243, 386

(56) References Cited

U.S. PATENT DOCUMENTS

| 5,291,438 | A | * | 3/1994 | Witek et al. ............. 365/149 |
| 5,930,107 | A | * | 7/1999 | Rajeevakumar .......... 361/321.4 |
| 5,985,729 | A | | 11/1999 | Wu ........................ 438/389 |
| 6,251,722 | B1 | | 6/2001 | Wei et al. ................ 438/343 |
| 6,297,088 | B1 | * | 10/2001 | King ....................... 438/243 |
| 2002/0127795 | A1 | * | 9/2002 | Shih ....................... 438/243 |

FOREIGN PATENT DOCUMENTS

EP            1150349 A2 * 10/2001 ........ H01L/21/8242

* cited by examiner

*Primary Examiner*—Allan R. Wilson
(74) *Attorney, Agent, or Firm*—Laurence A. Greenberg; Werner H. Stemer; Gregory L. Mayback

(57) ABSTRACT

A trench capacitor has a first capacitor electrode, a second capacitor electrode, and a dielectric, which is arranged between the capacitor electrodes. The first capacitor electrode has a tube-like structure, which extends into a substrate. The second capacitor electrode includes a first section which is opposite to the internal side of the tube-like structure, with the dielectric arranged therebetween, and a second section, which is opposite to the external side of the tube-like structure with the dielectric arranged therebetween.

16 Claims, 4 Drawing Sheets

TRENCH CAPACITOR AND METHOD FOR MANUFACTURING THE SAME

BACKGROUND OF THE INVENTION

1. Field of the Invention

The present invention relates to a novel trench capacitor and a method for manufacturing the same.

2. Description of Prior Art

A number of manufacturing methods for trench capacitors is known in the state of the art, in which a deep trench is etched into a substrate, usually a p-substrate, and an oxide collar is formed either during or after the etching process, which switches off the vertical, parasitary field effect transistor, which develops later. The bottom electrode of such a trench capacitor is usually generated by diffusing As into the substrate. Alternatively, a buried doped layer, which is an $n^+$-layer, when a p-substrate is used and which is referred to as a so-called buried plate, may be used as a bottom electrode. In the trench, the storage dielectric and, onto the storage dielectric, the counterelectrode and/or the top electrode are deposited. As a rule, the top electrode is a polycrystalline semiconductor material, which fills the trench remaining as a result of the deposition of the storage dielectric. Subsequently, the top electrode is etched back, and, via a connection area, which is usually referred to as a buried strap, is connected to the assigned selection transistor of a DRAM cell. In such an application of the trench capacitor in a DRAM cell, the charge is stored in the top electrode.

SUMMARY OF THE INVENTION

It is the object of the present invention to provide a trench capacitor having an increased capacity and a method for manufacturing such a trench capacitor.

According to a first aspect of the present invention this object is achieved by a trench capacitor having a first capacitor electrode, a second capacitor electrode, and a dielectric arranged between the capacitor electrodes. The first capacitor electrode comprises a tube-like structure projecting into a substrate. The second capacitor electrode comprises a first section, which is opposite to the tube-like structure with the dielectric of the internal side arranged therebetween, and further comprises a second section, which is opposite to the tube-like structure with the dielectric of the external side arranged therebetween.

According to a second aspect of the invention this object is achieved by a method for manufacturing a trench capacitor including the steps of:

generating a trench in a substrate of a first doping type, wherein a section of a second doping type adjoins a portion of the trench;

generating, at least on the side walls of the trench, a first dielectric layer;

generating a conductive layer on the first dielectric layer;

generating a second dielectric layer on the conductive layer; and generating conductive areas on the second dielectric layer, which are conductively connected to the section of a second doping type.

The inventive trench capacitor, which, in particular, is suitable for use as a storage capacitor, e.g. of a DRAM cell, thus comprises an upper and/or top electrode, which consists of a tube-shaped structure, which, both on its inside and outside, comprises a storage dielectric and a counterelectrode. Thus, compared to conventional trench capacitors, the capacity may be approximately doubled by the increase of the capacitor surface. Moreover, the region, in which the collar oxide is formed, may be used for the capacitor.

The inventive trench capacitor is scalable up to structure sizes of 100 nm and ensures a low lead resistance. As described, owing to the special structure, the capacitor surface, and, thus the capacitance, is about two times as large as are conventional structures.

In the inventive method for manufacturing the trench capacitor, use may be made of standard processes, as are employed in the manufacture of conventional trench capacitors, until the upper electrode is generated. Then, instead of a thick upper electrode, which fills the whole of the trench, only a relatively thin layer, in the magnitude of 20 nm, of a well-conducting material, e.g. metal, is deposited. Subsequently, a spacer etching will be carried out, which again opens this layer at the lower end of the trench capacitor. After depositing a second storage dielectric and a thin protective layer, which will act as an electrode later on, a spacer etching is again carried out, such that the bottom electrode is exposed again. A deposition of a polycrystalline semiconductor material, preferably polysilicon, now connects the inner electrode to the substrate, i.e. the doped areas of the same, which form the bottom electrode. After a step of recess-etching the polycrystalline filling, an insulator will be applied in order to insulate the inner counterelectrode sections lying opposite to the upper electrode from a conductive polycrystalline semiconductor material, which is then to be inserted into the recess-etched section of the trench. This polycrystalline semiconductor material, which is to be inserted, serves as a connection area for the top electrode in the form of a buried strap. Subsequently, standard processes may be used to finish the DRAM cell.

Further developments of the present invention are set forth in the dependent claims.

BRIEF DESCRIPTION OF THE DRAWINGS

Preferred embodiments of the present invention will be described below with reference to the attached drawings, in which.

DESCRIPTION OF PREFERRED EMBODIMENTS OF THE INVENTION

In the following, with reference to the attached drawings, a special preferred embodiment for manufacturing a trench capacitor will be explained.

Figure 1:
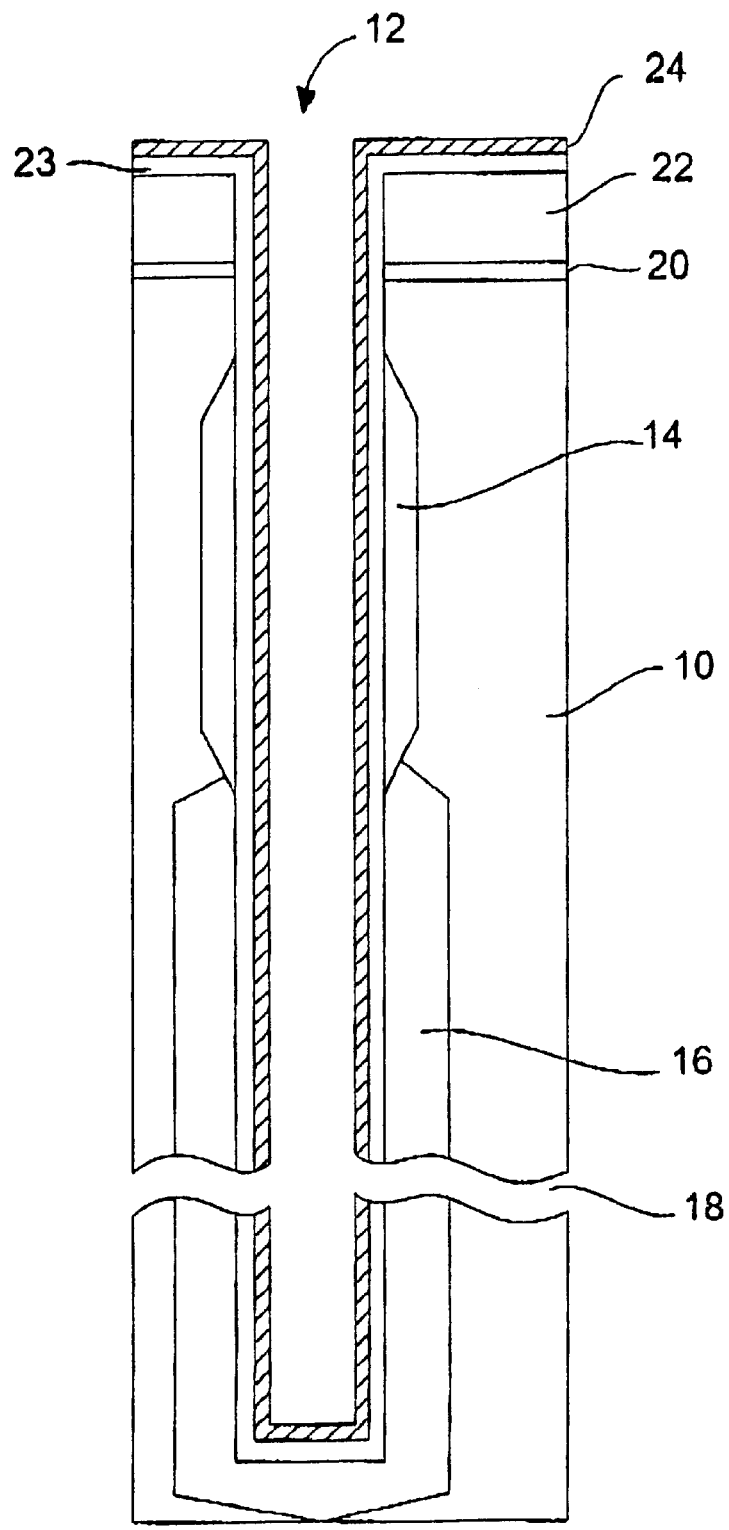
FIGS. 1–3 show schematic cross-section views of different phases of an embodiment of the inventive method for manufacturing a trench capacitor.

At first, in a semiconductor substrate 10 of a first doping type, which, in the shown embodiment, is a p-silicon substrate, a trench 12 will be generated, which, in accordance with FIG. 1, has already been submitted to a number of steps. Preferably, the trench is generated by etching, wherein, simultaneously to the generation of the trench or after the generation of the same, a buried oxide collar 14 is formed in a known manner. This oxide collar serves to switch off the vertical parasitary field effect transistor, which is generated later on. Optionally, the trench may be spread, which is also called "bottling", which, however, is not shown in the drawings.

Subsequently, the bottom electrode 16 is generated by diffusing a suitable n-dopant. Preferably, As may be used here as a diffusion material. Instead of carrying out a diffusing process for generating the n$^+$-bottom electrode, use may be made of a substrate, which comprises a buried n$^+$-layer in the form of a buried plate, wherein, then, a separate diffusion of the bottom electrode is not necessary. Optionally, a metallic layer (not shown) may be generated on the bottom electrode 16.

Here, it should be noted that, for the purpose of convenience of viewing, an interruption 18 is provided in the figures to show that, in reality, the trench of a trench capacitor, in comparison to the shown depth, comprises a raised depth.

On the surface of the substrate 10, there is an oxide layer 20 in the usual form, preferably an SiO$_2$ layer. On the oxide layer 20, a nitride layer 22 is provided.

A deposition of a first storage dielectric 23 is carried out onto the available structure. Then, a conductive layer 24, which is a metal layer in the preferred embodiment, is deposited onto this storage dielectric 23. The structure resulting from this deposition is shown in FIG. 1. The metal layer 24, which serves as a top electrode for the finished trench capacitor, may eg possess a thickness of 20 nm. As a dielectric 23, a nitride oxide layer sequence (NO) or an oxide nitride oxide layer sequence (ONO) is preferably be deposited.

Figure 2:
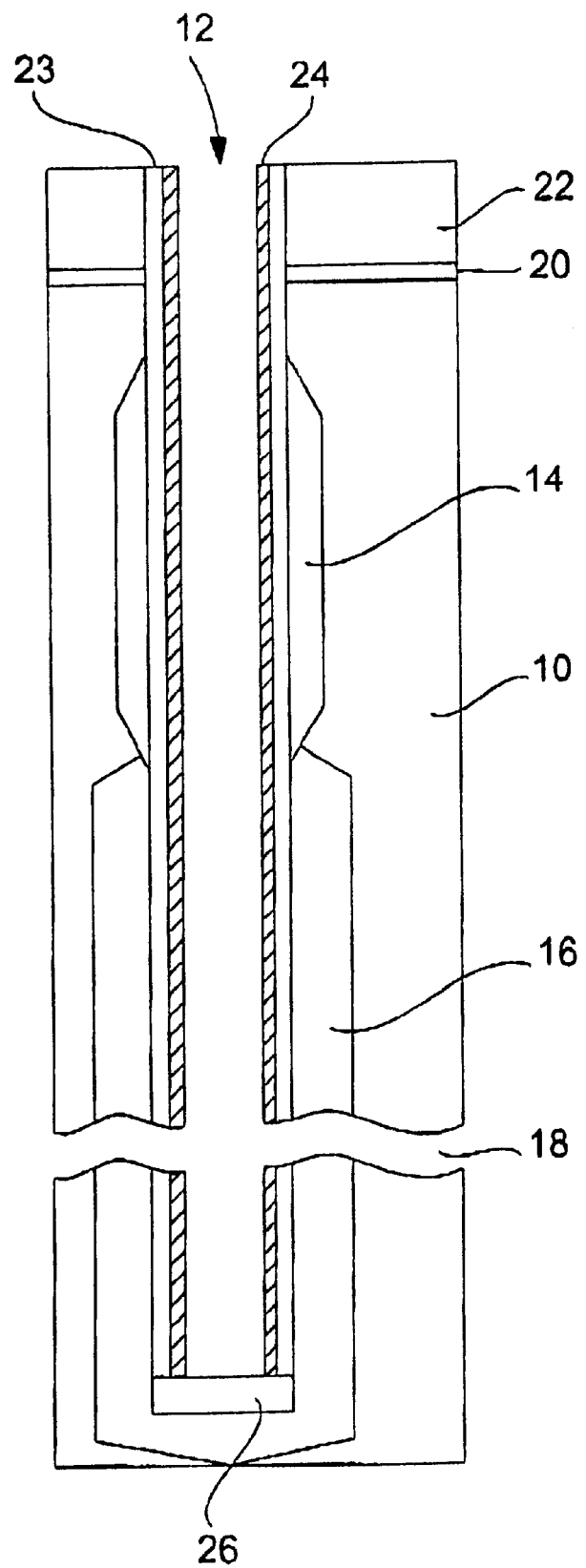

Starting from the structure, as it is shown in FIG. 1, the metal layer 24 and the dielectric 23 are submitted to an anisotropic etching process. As a result, the metal layer 24 on the upper surface of the substrate and on the bottom surface of the trench, i.e. on the horizontal surfaces, is removed, while such an etching of the dielectric 23 is carried out so that the same is also removed on the bottom side of the trench. At the bottom of the trench, a selective oxidation of a silicon-to-metal-electrode is carried out to generate a bottom oxide layer 23 at the bottom of trench 12. This bottom oxide layer 23 reaches below the metal layer 24 such that the same is electrically insulated from the doped area 16. The resulting structure is shown in FIG. 2.

Figure 3:
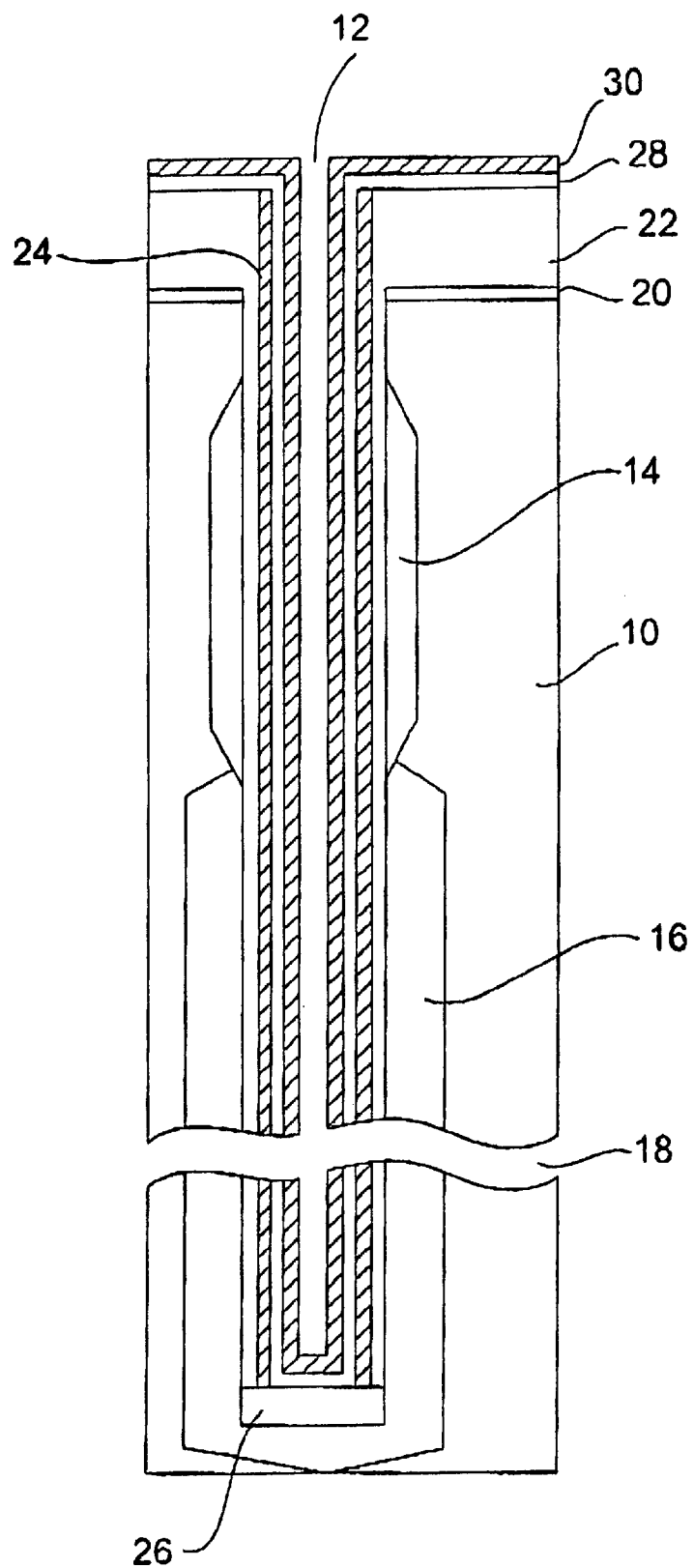

Starting from this structure, a second dielectric 28, preferably an NO or ONO layer sequence, is now deposited. Alternatively, other dielectrics, in particular metal oxides, such as e.g. Al$_2$O$_3$, HfO or Ta$_2$O$_5$, may be considered. Then, a further conductive layer 30 is deposited onto this second dielectric 28. This further conductive layer 30 may be a thin polysilicon layer or a metal layer, wherein the thickness of the same may range in a magnitude of 10 nm. After depositing these two layers, the structure shown in FIG. 3 is provided.

The two last deposited layers, i.e. the second dielectric 28 and the conductive layer 30, together with the bottom oxide layer 26, are then anisotropically etched such that, at the lower end, i.e. at the bottom of the trench, the substrate, i.e. the n$^+$-area 16 of the same, is exposed. After this etching, a polysilicon layer is deposited, which fills the rest of the trench. Optionally, an SiN interface formation may be carried out here. This polysilicon trench formation is conductively connected to the n$^+$-area via the opening which has been previously generated in the bottom.

Subsequently, etching back of the polysilicon filling is carried out such that the same comprises the shape 32 shown in FIG. 4. As a result, the polysilicon layer is submitted to a recess-etching process, e.g. to a depth of approximately 500 nm below the silicon surface. Subsequently, the second metal electrode, selectively with respect to the second dielectric 28, is etched back to the same depth as the polysilicon filling 32. On the etched back polysilicon filling 32 and the etched back conductive layer 30, an upper oxide layer 34 is generated. This layer may be formed either by oxidation or by high-density plasma oxide deposition. This upper oxide layer, the dielectric 28, the metal layer 24 and the dielectric 23 are then etched back, e.g. until approximately 300 nm below the surface of the substrate 10.

Subsequently, an etching of the oxide collar in the upper area may be effected eg by an HF dip. Then, a buried strap 36 is generated in the section of the trench remaining in the substrate 10, as is the case in the conventional standard process for generating trench capacitors. Further, the trench structuring remaining in the oxide layer 20 and the nitride layer 22 may be filled by an oxide filling 38.

Figure 4:
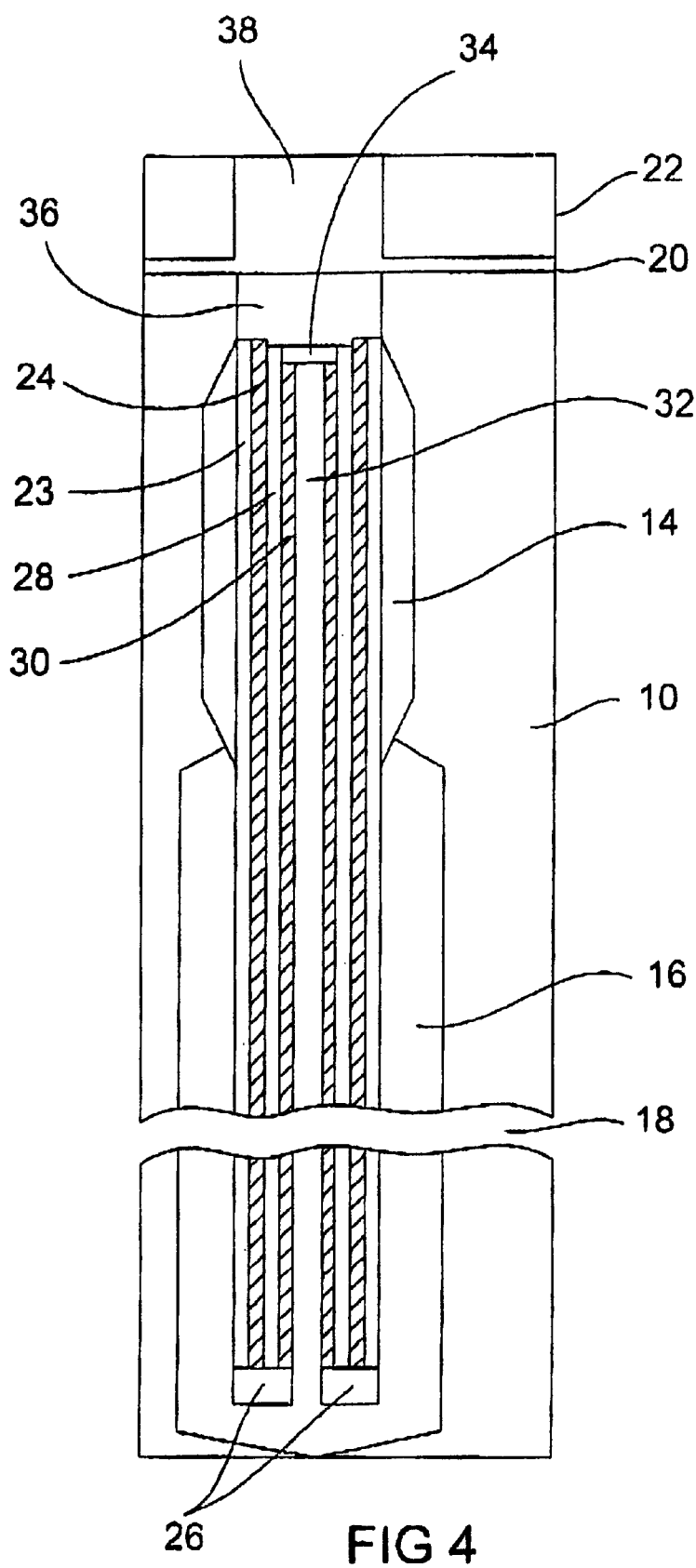
FIG. 4 shows a schematic cross-section view showing the embodiment of the inventive trench capacitor after its manufacture.

The thus resulting structure is shown in FIG. 4, wherein from this stage of the method, conventional processes, e.g. for forming a planar or a vertical selection transistor, may be used to manufacture a DRAM storage cell. Just for the completion of the matter, it should be noted, that the buried strap 36 is connected to the drain of the respective selection transistor.

It can be clearly seen from the cross-section representation of the inventive trench capacitor shown in FIG. 4 that the same, in contrast to prior art capacitors, comprises a much greater capacitor surface and thus a higher capacity. This is accounted for by the fact that the upper electrode, which is formed by the metal layer 24, comprises a tube-like structure, wherein the buried strap 36 so to say forms a cover of the tube and serves for connecting this electrode. Further, the counterelectrode, i.e. the bottom electrode, includes external sections, which are formed by the n$^+$-doped areas 16, and an inner section, which is formed by the polysilicon filling 32 and the metal layer 30. This inner section is opposite to the internal side of the electrode 24, with the second dielectric 28 arranged therebetween. The outer section 16 is opposite to the external side of the electrode 24, with the first dielectric 23 arranged therebetween.

The above-described steps for manufacturing the inventive trench capacitor may be carried out by using conventional technologies for generating integrated and/or highly integrated circuits, wherein there is no need to make detailed reference to the lithographic methods and the like, which are to be individually carried out.

The inventive trench capacitor is not limited to the described structure, but the upper electrode may rather comprise eg a plurality of tube-like structures, wherein counterelectrodes are each arranged within and outside of the same, such that an increase of the same exceeding a doubling of the capacitor surface may be reached.

REFERENCE NUMBER LIST 10 substrate
12 trench
14 oxide collar
16 bottom electrode
18 interruption
20 oxide layer
22 nitride layer
23 first dielectric
24 conductive layer
26 bottom oxide layer
28 second dielectric
30 conductive layer
32 polysilicon filling
34 oxide layer 36 buried strap
38 oxide filling

What is claimed is:

1. Trench capacitor, comprising:

a first capacitor electrode;

a second capacitor electrode; and a dielectric arranged between the capacitor electrodes,
wherein the first capacitor electrode comprises a tube-like structure extending into a substrate, and
wherein the second capacitor electrode comprises a first section, which is opposite to the internal side of the tube-like structure, with the dielectric arranged therebetween, and which comprises a second section, which is opposite to the external side of the tube-like structure, with the dielectric arranged therebetween,
wherein areas of the first section of the second capacitor electrode and of the internal side of the tube-like structure, which are positioned opposite to each other, extend into a region, in which a collar oxide is formed, which comprises a greater thickness than the dielectric, which is arranged between the second section of the second capacitor electrode and the external side of the tube-like structure.

2. Trench capacitor in accordance with claim 1, which is formed in a substrate of a first doping type.

3. Trench capacitor in accordance with claim 2, wherein the second section of the second capacitor electrode comprises doped areas of a second doping type.

4. Trench capacitor in accordance with claim 2, wherein the first section of the second capacitor electrode comprises a doped area of a second doping type.

5. Trench electrode in accordance with claim 2, wherein the first section of the second capacitor electrode comprises a metal layer.

6. Trench capacitor in accordance with one of claims 1, wherein sections of the first electrode being opposite to the second electrode are formed by a metal layer.

7. Trench capacitor in accordance with claim 2, wherein the first electrode comprises a connection area from a doped material of a second doping type.

8. Trench electrode in accordance with claim 1, wherein the dielectric comprises a nitride oxide layer sequence or an oxide nitride oxide layer sequence or a metal oxide.

9. Method for manufacturing a trench capacitor, comprising the steps of:

generating a trench in a substrate of a first doping type, wherein a section of a second doping type adjoins a portion of the trench;

subsequently generating a first dielectric layer at least on side walls of the trench;

subsequently generating a conductive layer on the first dielectric layer opposite to the section of the second doping type;

subsequently generating a second dielectric layer on the conductive layer; and subsequently generating conductive areas on the second dielectric layer, which are opposite to the conductive layer with the second dielectric arranged therebetween and which are electrically conductively connected to the section of a second doping type.

10. Method in accordance with claim 9, wherein the step of generating conductive areas on the second dielectric layer comprises the step of depositing a metal layer onto the second dielectric layer.

11. Method in accordance with claim 9, wherein the step of generating conductive areas on the second dielectric layer comprises the step of generating a polycrystalline semiconductor layer in empty spaces remaining in the trench.

12. Method in accordance with claim 9, wherein the conductive layer generated on the first dielectric layer is a metal layer.

13. Method in accordance with claim 9, which further comprises a step of generating, in an upper exposed area of the trench, a connection area from a polycrystalline semiconductor material of the second doping type, which is electrically conductively connected to the conductive layer generated on the first dielectric layer.

14. Method in accordance with claim 9, which, prior to the step of depositing the second dielectric layer, further comprises a step of structuring the first dielectric layer and the conductive layer deposited on the same to expose the bottom of the trench and a step of generating an insulating layer on the exposed bottom such that the insulating layer extends under the first dielectric layer and the conductive layer deposited on the same.

15. Method in accordance with claim 14, which further comprises a step of structuring the second dielectric layer to expose the insulating layer and a step of structuring the insulating layer in the exposed area to expose an area of the section of the second doping type adjoining the trench, via which the conductive area to be generated on the second dielectric layer is connected to the section of the second doping type.

16. Method in accordance with claim 9, which further comprises a step of generating an insulating layer on the conductive area generated on the second dielectric layer such that this area is insulated from a connection area for the conductive layer generated on the first dielectric layer, which is to be generated in the upper area of the trench.

* * * * *